US009000439B2

(12) United States Patent
Lee et al.

(10) Patent No.: US 9,000,439 B2
(45) Date of Patent: Apr. 7, 2015

(54) TRANSPARENT THIN FILM HAVING CONDUCTIVE AND NONCONDUCTIVE PORTIONS, METHOD OF PATTERNING THE PORTIONS, THIN-FILM TRANSISTOR ARRAY SUBSTRATE INCLUDING THE THIN FILM AND METHOD OF MANUFACTURING THE SAME (71) Applicant: Samsung Display Co., Ltd., Yongin, Gyeonggi-Do (KR)

(72) Inventors: Dae-Young Lee, Suwon-si (KR); Ki-Beom Lee, Seoul (KR); Kyu-Young Kim, Suwon-si (KR); Nam-Ok Jung, Suwon-si (KR); Gug-Rae Jo, Asan-si (KR)

(73) Assignee: Samsung Display Co., Ltd. (KR)

( * ) Notice: Subject to any disclaimer, the term of this patent is extended or adjusted under 35 U.S.C. 154(b) by 212 days.

(21) Appl. No.: 13/678,313

(22) Filed: Nov. 15, 2012

(65) Prior Publication Data
US 2013/0264572 A1 Oct. 10, 2013

(30) Foreign Application Priority Data

Apr. 6, 2012 (KR) ........................ 10-2012-0035793

(51) Int. Cl.
*H01L 29/04* (2006.01)
*H01L 27/12* (2006.01)
*H01L 21/28* (2006.01)
*H05K 1/02* (2006.01)
*H05K 1/09* (2006.01)
*G02F 1/1343* (2006.01)

(52) U.S. Cl.
CPC .............. *H01L 27/124* (2013.01); *H01L 21/28* (2013.01); *H05K 1/02* (2013.01); *H05K 1/09* (2013.01); *G02F 1/13439* (2013.01)

(58) Field of Classification Search
CPC ........ H01L 27/124; H01L 21/28; H05K 1/09; H05K 1/02; G02F 1/13439
USPC ................ 257/59, 72, 88, E33.053, E31.126, 257/E33.068
See application file for complete search history.

(56) References Cited

U.S. PATENT DOCUMENTS 5,907,380 A * 5/1999 Lien .............................. 349/141
8,766,306 B2 * 7/2014 Lifka et al. ....................... 257/98

(Continued)

FOREIGN PATENT DOCUMENTS

KR 0405977 11/2003
KR 0638809 10/2006

*Primary Examiner* — Cuong Q Nguyen
*Assistant Examiner* — Yosef Gebreyesus
(74) *Attorney, Agent, or Firm* — Innovation Counsel LLP (57) ABSTRACT A homogenous thin film layer is patterned into a transparent conductive portion and a non-conductive portion without use of etching through the thin film. Instead, conductive fine-wires which are convertible in one embodiment into non-conductive fine-wires are selectively converted into the non-conductive form. In an alternate embodiment, the homogenous thin film layer which includes conductive fine-wires is provided in a curable liquid form and selected portions of the liquid formed are cured into being affixed to substrate. Remaining portions can be washed away. In the case of display devices using transparent electrodes, a thin thin-film transistor array substrate is provided where the initially homogenous thin film which is and then converted into patterned conductive and non-conductive sections forms the pixel-electrodes and/or common electrode of the display device.

20 Claims, 6 Drawing Sheets (56) References Cited

U.S. PATENT DOCUMENTS

| | | | |
|---|---|---|---|
| 2002/0089625 A1* | 7/2002 | Grupp | 349/110 |
| 2005/0062907 A1* | 3/2005 | Matsuoka et al. | 349/106 |
| 2006/0183342 A1* | 8/2006 | Bruyns et al. | 438/768 |
| 2007/0105321 A1 | 5/2007 | Lee et al. | |
| 2010/0055824 A1* | 3/2010 | Lin et al. | 438/73 |
| 2012/0015098 A1* | 1/2012 | Cheng et al. | 427/110 |
| 2012/0231241 A1* | 9/2012 | Fujita | 428/203 |
| 2012/0241199 A1* | 9/2012 | Kobayashi et al. | 174/250 |

* cited by examiner

TRANSPARENT THIN FILM HAVING CONDUCTIVE AND NONCONDUCTIVE PORTIONS, METHOD OF PATTERNING THE PORTIONS, THIN-FILM TRANSISTOR ARRAY SUBSTRATE INCLUDING THE THIN FILM AND METHOD OF MANUFACTURING THE SAME

This application claims priority under 35 U.S.C. §119 to Korean Patent Application No. 10-2012-0035793, filed on Apr. 6, 2012 in the Korean Intellectual Property Office, the contents of which application are herein incorporated by reference in their entireties.

BACKGROUND

1. Field of Disclosure

The present disclosure of invention relates to a thin film and a to a method of patterning the thin film so that the thin film has one or more patterned conductive portions and one or more patterned nonconductive portions. The present disclosure also relates to a thin-film transistor array substrate that includes the patterned thin film as defining pixel-electrodes of the substrate and to a method of manufacturing such a thin-film transistor array substrate.

2. Discussion of Related Technologies

Indium oxide compounds such as indium tin oxide (ITO), indium zinc oxide (IZO), etc. have been widely used in the past as materials of choice for making transparent electrodes in various electronic products including image forming and displaying products.

In recent years, it has become apparent that the indium element which serves as the base raw material for forming the various Indium oxide compounds (e.g., ITO, IZO, etc.) is becoming rare, hard to obtain, and more expensive. Thus, mass production of various electronic products that rely on a steady, reliable and cheap supply of Indium (In) is becoming problematic. Additionally, when transparent conductive thin films including indium oxide compounds are formed, for example by sputtering, a vacuum is typically needed, so that a manufacturing cost of electronic products based on such vacuum-requiring technology is increased. Also, the Indium oxide compounds tend to be brittle, thus durability is low. In order to begin solving such problems, development has begun on alternative materials that can function as transparent conductive electrodes.

More specifically, it has been proposed to use an ink including small metal wires and a binder ("micro-wires ink"). In one variation, it has been proposed that these small metal wires should be nano sized and used as a substitute for Indium oxide compounds. The proposed nano-wires ink is proposed to be easily coatable on a substrate under non-vacuum conditions so as to form transparent conductors. If this can be done, mass production manufacturing costs may be greatly decreased.

The proposed use of nano-wire ink should provide the advantage of it being easily blanket-wise formed as a transparent conductor layer on the whole surface of a substrate. Part of the proposal is that, after being blanket deposited, the nano-wire ink should be selectively etched through to thereby define nonconductive regions in the layer that holds the nano-wire ink. However, selectively etching of the nano-wire ink layer may bring new problems. For example, after a binder is formed for fixing (bonding) the nano metal wires of the ink to a substrate surface, the subsequent etching-through process may result in formation of acute undercut angles between a being-etched sidewall surface of the transparent thin film and a surface of the substrate. That is, due to sidewall etching effects, a large skew undercut may develop in the formed transparent pattern. Such an excessively skewed transparent pattern may easily become detached (partially removed, delaminated) from the substrate during or after the etch-based patterning process of the thin film, and as a result a manufacturing reliability of the transparent conductor film may be undesirably decreased.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

In accordance with the present disclosure of invention, a transparent thin film is provided that is patterned to have one or more conductive portions and one or more non-conductive portions of respective shapes where at least the conductive portions are stably and well adhered to an underlying base substrate.

The present disclosure of invention also provides a method of patterning a transparent thin film without etching through the thin film to thereby improve manufacturing reliability.

The present disclosure of invention also provides a thin-film transistor array substrate that includes the stably adhered and patterned thin film for defining a corresponding plurality of transparent electrodes (e.g., pixel-electrodes).

The present disclosure of invention also provides a number of methods of manufacturing such a thin-film transistor array whereby manufacturing reliability is improved by avoiding an etch-through undercut problem as recognized above.

In an example embodiment of a transparent thin film layer according to the present disclosure of invention, such a thin film includes a conductive transparent electrode portion having a plurality of conductive fine-wires, where the conductive electrode pattern is well adhered to a base substrate. The transparent thin film also includes a non-conductive sub-portion disposed in the same plane or in the same layer as the transparent electrode pattern, where at least one of the non-conductive sub-portion includes at least one member selected from the group consisting of a non-conductive oxide of the conductive fine-wires, or a non-conductive chloride of the conductive fine-wires or a non-conductive fluoride of the conductive fine-wires. By "fine-wires" as used herein it is understood that such are extremely narrow in their width direction (for example in the deep submicron range, e.g., only a few nanometers wide) whereby light rays can easily pass around the extremely narrow widths of the fine-wires so that the corresponding thin film is relatively transparent. On the other hand, the lengths of the fine-wires may be much larger that their widths, for example in the range of a few microns or even larger.

In an example embodiment of the present disclosure, the conductive fine-wires may include silver (Ag) or copper (Cu).

In an example embodiment of the present disclosure, an optical transmittance efficiency of the transparent electrode pattern is from about 85% to about 95% with respect to a light having a wavelength of about 550 nm.

In an example embodiment of the present disclosure, a surface resistivity of the transparent electrode pattern is from about 15 ohm/square ($\Omega/\square$) to about 110 ohm/square ($\Omega/\square$), and a surface resistance of the non-conductive sub-portion is greater than about 1 MΩ/□ and may range in one class of embodiments to about 110 MΩ/□.

In an example embodiment, the conductive electrode pattern may make contact with an immediately adjacent non-conductive sub-portion of the transparent thin film.

According to an exemplary embodiment, a method of pattering a transparent thin film starts with blanket-wise providing a homogenous version of the thin film on a base substrate where the homogenous version includes conductive fine-wires and a curable binder. In one variation, the curable binder is permeable to a reactive gas such as an oxidizing gas, a chlorinating or a fluoridating gas and the fine-wires are convertible into non-conductive counterparts upon reacting with the reactive gas. Therefore in the method of patterning, a homogenous transparent thin film layer having reactable fine-wires is formed on a base substrate, and part of the initially provided thin film is converted into a non-conductive sub-portion having at least one member selected from the group consisting of oxides of the original fine-wires, chlorides of the original fine-wires and fluorides of the original fine-wires.

More specifically, in an example embodiment, a gas-impermeable mask protectively covers a first area of the transparent thin film layer but exposes a second area. A reaction gas is provided through the mask to selectively react with the second area of the transparent thin layer exposed by the mask. After the non-conductive sub-portion is formed, the mask may be removed.

In another example embodiment, the non-conductive sub-portion is formed by selectively irradiating with laser that heats a portion of the transparent thin layer to an oxidizing temperature, and then the non-conductive sub-portion which includes the oxides of the original fine-wires is selectively formed in a desired pattern. A wavelength of the laser is from about 330 nm to about 500 nm, and unit of a pulse length of the pulsed laser is about one Pico second.

According to another exemplary, a liquid transparent thin film layer having fine-wires homogenously mixed with a liquid polymer precursor composition is formed on a base substrate. A photo pattern may be formed on the transparent thin layer in a first area of the base substrate. A light is irradiated on the transparent thin layer exposed by the photo pattern in a second area of the base substrate so as to cure (and convert into an adhered solid form) the selectively irradiated portion. The photo pattern and the uncured portion(s) of the transparent thin layer are removed to thereby form a patterned and conductive transparent electrode having the fine-wires and the polymerized (cured) precursor composition in the second area.

In an example embodiment, the polymer precursor composition may include a mono-functional monomer of about 10 weight % to about 20 weight % with respect to a total weight of the polymer precursor composition, a dual-functional monomer of about 20 weight % to about 60 weight % with respect to the total weight of the polymer precursor composition, a multi-functional monomer of about 10 weight % to about 30 weight % with respect to the total weight of the polymer precursor composition, a photo initiator of about 3 weight % to about 5 weight % with respect to the total weight of the polymer precursor composition and an extra solvent.

According to another exemplary embodiment, a thin-film transistor array substrate may include a gate line formed on a base substrate, a data line extended in a direction crossing the gate line, a thin-film transistor connected to the gate line and the data line and a patterned pixel electrode. The pixel electrode includes a transparent conductive portion having conductive fine-wires, and a non-conductive sub-portion disposed on a same plane or in a same layer as the conductive transparent portion. In one embodiment, the non-conductive sub-portion includes at least one member selected from the group consisting of oxides of the fine-wires, chlorides of the fine-wires, and fluorides of the fine-wires.

According to another exemplary embodiment, a method of manufacturing includes forming a gate line, a data line and a thin-film transistor on a base substrate, where the data line is extended in a direction crossing the gate line, and the thin-film transistor is connected to the gate line and the data line. Next, a patterned pixel electrode is formed on the base substrate having the already formed thin film transistor. The patterned pixel electrode includes a transparent conductive portion having conductive fine-wires, and a non-conductive sub-portion being disposed on a same plane or in a same layer as the transparent electrode pattern, where the non-conductive sub-portion comprises at least one member selected from the group consisting of oxides of the fine-wires, chlorides of the fine-wires and fluorides of the fine-wires are formed.

In an example embodiment, a homogenous transparent thin film layer is first blanket-wise formed on a substrate, the initial thin film layer having conductive fine-wires and a curable binder or polymer precursor. A gas-masking photo pattern is formed on the transparent thin layer and a reaction gas is provided to chemically react with and convert exposed portions into non-conductive portions. Thus, the patterned pixel electrode may be formed.

In an example embodiment, the non-conductive sub-portion may be formed by irradiating with a pulsed laser onto a portion of the transparent thin layer, and unit of a pulse length of the pulse laser is about one Pico second.

According to another exemplary embodiment, a gate line, a data line and a thin-film transistor are formed on a base substrate, the data line being extended in a direction crossing the gate line, the thin-film transistor being connected to the data line and the gate line. A transparent thin film layer having conductive fine-wires and a liquid polymer precursor composition is provided onto the base substrate having the thin-film transistor already formed thereon. A photo patterned mask is provided on the transparent thin layer to protect a first area from precursor curing radiation. A light is irradiated on the transparent thin layer exposed by the photo pattern in a second area of the base substrate to thereby cure it. The uncured portion(s) of the transparent thin film fine-wires (parts still having the uncured and thus liquid polymer precursor composition) are removed (e.g., washed away). Thus, a pixel electrode including a patterned transparent electrode portion is provided with light-passing but conductive fine-wires and the cured (polymerized) precursor composition.

Since etching-through is not performed on the transparent thin film in order to pattern it into the conductive and the non-conductive sub-portions, the danger of delamination (disconnecting of the transparent thin layer from its base substrate) is reduced and a fine-wirestransparent electrode pattern having a stable structure is provided. That is, the transparent electrode is not subjected to an etching therethrough process, so that a risk of disconnection is prevented and the transparent thin layer is easily patterned. Also, in one embodiment, the non-conductive sub-portion is not removed from the substrate and remains adhered to the base substrate. The non-conductive sub-portion may be formed by a selective chemical patterning step using a chemical reaction of the fine-wires which converts them into non-conductive versions. Thus all the substrate area may be covered with the transparent electrode pattern or the non-conductive sub-portion. Therefore, reflectivity of the transparent electrode pattern is substantially the same as the non-conductive sub-portion, so that the shape of the transparent electrode pattern may not be easily viewed by a viewer.

Also, the nonconductor may define a barrier to chemical leaching. Thus, pollution of the transparent electrode pattern caused by residual particles from patterning may be prevented. The residual particles may be created during forming of the thin film by using a laser.

In addition, when the transparent thin layer includes a liquid polymer precursor composition reacting by a light, the transparent thin layer may be patterned without need for any additional photo pattern for an etch stop layer. Thus, manufacturing process may be simplified and costs reduced. Furthermore, length of etching skew (undercut) of the transparent electrode pattern may be minimized or obviated.

BRIEF DESCRIPTION OF THE DRAWINGS

The above and other features and advantages of the present disclosure of invention will become more apparent by describing in detailed exemplary embodiments thereof with reference to the accompanying drawings, in which.

DETAILED DESCRIPTION

Hereinafter, embodiments in accordance with the present disclosure of invention will be described in detail with reference to the accompanying drawings.

Figure 1:
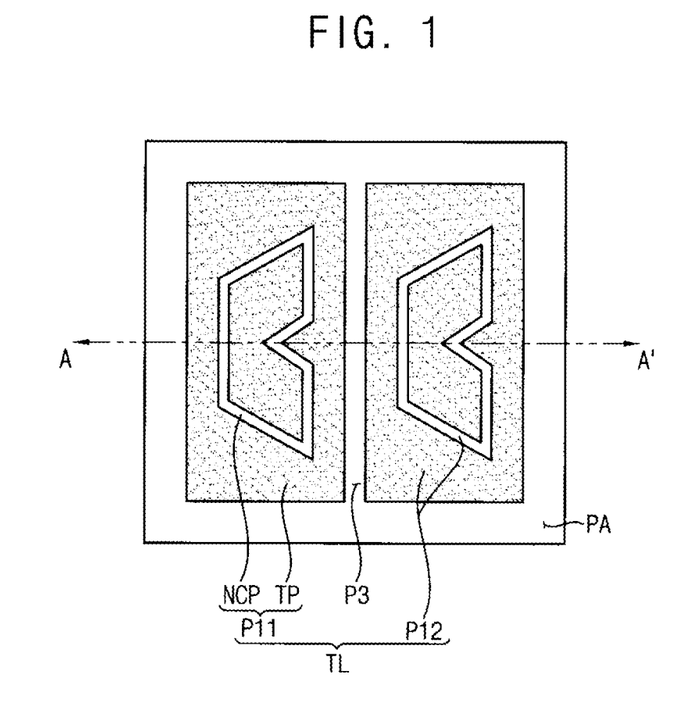
FIG. 1 is a top plan view illustrating a patterned thin film that may be formed according to an exemplary embodiment of the present disclosure.
Figure 2:
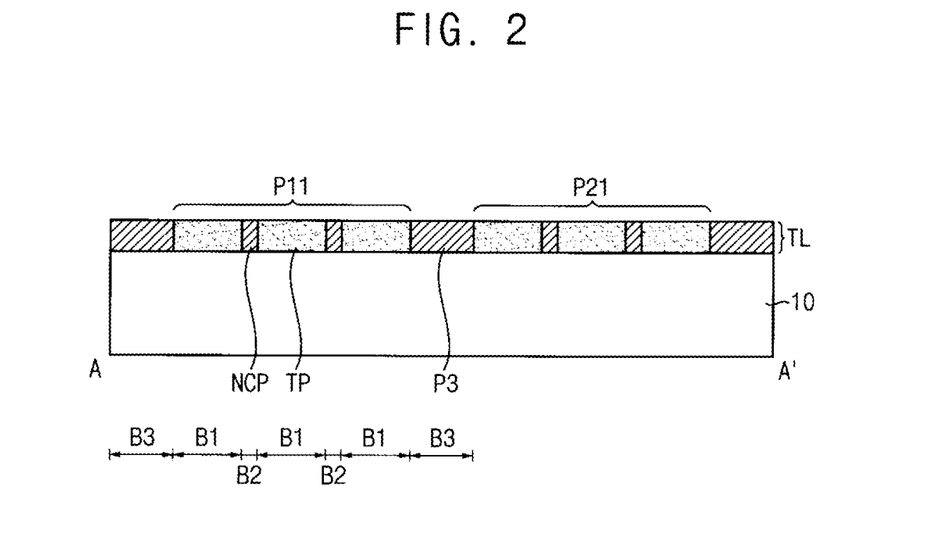
FIG. 2 is a cross-sectional view cut along a line A-A' shown in FIG. 1.

FIG. 1 is a top plan view illustrating a patterned thin film formed according to an exemplary embodiment of the present disclosure. FIG. 2 is a cross-sectional view cut along a line A-A' of FIG. 1.

Referring to both of FIG. 1 and FIG. 2, a unitary thin film TL is formed on a base substrate 110 where the unitary thin film TL is internally non-homogenous such that it includes a first patterned portion P11, a second patterned portion P21 and a third patterned portion P3. The third patterned portion P3 is contiguous with a peripheral area portion PA of the unitary thin film TL, where the peripheral area portion PA fully surrounds the first patterned portion P11 and the second patterned portion P21. Each of the first patterned portion P11 and the second patterned portion P21 is defined herein as including a conductive and transparent electrode sub-portion TP and a non-conductive and transparent electrode sub-portion NCP. The third patterned portion P3 of the unitary thin film TL is defined herein as being entirely non-conductive and transparent and therefore it has a constitution essentially the same as the non-conductive sub-portion NCP of each of the first patterned portion P11 and second patterned portion P21. The first patterned portion P11 and the second patterned portion P21 may be electrically separated from one another by the third patterned portion P3. The term, "within the first boundary B1" is used herein, to refer to an area or sub-portion of the unitary thin film TL in which a conductive transparent portion TP is contained, for example the respective TP sub-portions of the first and second patterned portions P11 and P21. The term, "within the second boundary B2" is used herein to refer to an area or sub-portion of the unitary thin film TL in which a non-conductive sub-portion NCP of a respective patterned portion (e.g., P11 or P12) is formed. The term, "within the third boundary B3 is used herein to refer to an area or sub-portion of the unitary thin film TL in which a non-conductive sub-portion occurs which is part of the peripheral area portion PA or is contiguous therewith, such as in the illustrated example is the third patterned portion P3. In other words, the constituency of the peripheral area PA is that corresponding to what is referred to herein as being within the third boundary B3. The non-conductive material that is within the third boundary B3 need not be identical to that which is within the second boundary B2. For example, the material forming the peripheral area PA and the third patterned portion P3 may be opaque while that forming the respective non-conductive portions NCP within the first and second patterned portions P11 and P12 may respectively be transparent.

The thin film TL may overall continuously cover all or a substantial part of the upper major surface of the base substrate 110. More specifically, the unitary thin film TL may be formed so that its materials within the first boundary B1, the second boundary B2 and the third boundary B3 substantially cover all or substantially all of the upper major surface of the base substrate 110. Although in the illustrated example of FIGS. 1 and 2, each of the exemplary four transparent electrode patterned portions TP are completely physically spaced from each other (not in contact anywhere with one another), in an alternate embodiment, two or more of the transparent electrode patterned portions TP may be not entirely physically spaced from each other. In other words, they may be in partial, branched contact with one another, such as when they are used to define branch-wise inter-connected sub-pixels of a unitary pixel-electrode. Stated otherwise, to the transparent electrode patterned portions TP may be partially or fully separated from one another in a chemical and/or electrical sense where the separation function is provided by the non-conductive sub-portions NCP and/or the third patterned portion(s) P3 (only one shown in FIG. 1). In one embodiment, the base substrate 110 does not include a top surface potion that is not covered by the unitary thin film TL. The transparent electrode patterned portions TP, the non-conductive sub-portions NCP and the third patterned portion P3 make contact, one with the next.

More specifically, the transparent electrode patterned portions TP are configured to have electrical conductivity and optical transparency and thus define transparent conductive portions of the thin film TL. The material of the transparent electrode patterned portions TP may include a fixing binder and a plurality of fine-wires, where the fixing binder binds the fine-wires to the base substrate 10. Concentration of the fine-wires is such within the transparent electrode patterned portions TP (within first the boundary B1) that material of the transparent electrode patterned portions TP exhibits at least a predetermined minimum electrical conductivity and a predetermined minimum optical transmittance in the visible light portion of the spectrum. More specifically, in one embodiment, a luminance transmittance factor of the transparent electrode patterned portions TP may be from about 85% to about 95% with respect to a light having a wavelength of about 550 nm. Optical transmittance of the transparent electrode patterned portions TP tends to be related to the density of the fine-wires provided therein. When the transmittance is less than about 85%, the transmittance may be insufficient to function as a transparent electrode in certain applications (e.g., Liquid Crystal Display (LCD) devices). If the fine-wires were left out (omitted) the optical transmittance of the transparent electrode patterned portion TP may be about 95% or higher. That is, because the fine-wires are included (not left out) a portion of the sourced light of about 5% tends to be blocked (e.g., absorbed or reflected) by the fine-wires. The concentration and/or inter-connectivity of the fine-wires may be such that a surface resistance of the transparent electrode patterned portions TP is from about 15 ohm/square ($\Omega/\square$) to about 110 ohm/square ($\Omega/\square$) and therefore it may be used as an electrically conductive electrode.

The fine-wires may include silver (Ag) or copper (Cu), etc. Silver and copper are typically opaque metals. However, the fine-wires made of such metals are substantially of the rod type. Depending on the orientations and densities of the rods, light rays may easily pass through a material containing the rod type fine-wires. Accordingly, the fine-wires are arranged to have a light-passing density within the first boundary B1 which encloses the transparent electrode patterned portions TP. Thus, a transmittance of the transparent electrode patterned portions TP may be substantially from about 85% to about 95%.

The binder (not shown) serves to adhere the fine-wires to each other and to the base substrate 110. The binder may be composed of one or more water-soluble compounds. Examples of the binder materials include those such as, poly vinyl pyrrolidone PVP, carboxymethyl cellulose CMC, poly vinyl alcohol PVA, methyl cellulose MC, etc. The same binder may be used within each of the first boundary B1, the second boundary B2 and the third boundary B3.

The non-conductive sub-portions NCP may contain non-conductive oxides of the fine-wires, and/or non-conductive chlorides of the fine-wires and/or non-conductive fluorides of the fine-wires plus the binder. In other words, the normally conductive, metal fine-wires may be rendered non-conductive by treating them with an oxidizing, chlorinating and/or fluoridating agent. Therefore the non-conductive sub-portions NCP may include at least one member selected from the group consisting of an oxidized fine-wires, a chloridated fine-wires and a fluoridated fine-wires. The corresponding oxide(s) of the fine-wires and/or chloride(s) of the fine-wires and/or fluorides of the fine-wires should have a relatively large electrical resistivity. Thus, the oxide(s), fine-wireschloride(s) and/or fine-wiresfluoride(s) of the fine-wires behave substantially as nonconductors that do not readily conduct electric charge. For example, the non-conductive sub-portions NCP may include one or more of the insulative compounds: $Ag_2O$, AgCl, AgF, CuO, $CuCl_2$, $CuF_2$, etc. Due to the non-conductivity of the oxide(s), chloride(s) and/or fluoride(s) of the fine-wires, fine-wiresfine-wiresa surface resistance of the non-conductive sub-portion NCP may be from 1 M$\Omega/\square$ to 110 M$\Omega/\square$ or higher.

The binder in the NCP area may be substantially the same as the binder included in the transparent electrode patterned portion TP. Thus, overlapping description will be omitted. The binder in the NCP area serves to fix an oxide of the fine-wires, chloride of the fine-wires or fluoride of the fine-wires on the base substrate 10.

The third patterned portion P3 except for it being a pattern disposed within the third boundary B3 is substantially same as the non-conductive sub-portion NCP. Thus, overlapping description will be omitted.

In addition, each of the plan view outer boundary shapes of the first patterned portion P11 and of the second patterned portion P21 is defined by the third patterned portion P3 and the peripheral area PA. For example, each of the first patterned portion P11 and the second patterned portion P21 may be a rectangular or square shape electrically separated from the other by the third patterned portion P3. In each of the first patterned portion P11 and the second patterned portion P21, the respective transparent electrode patterned portions TP may be separated from one another by the shape of the non-conductive sub-portion NCP such that, for example an internal electrode is defined and an external electrode is defined wrapping about the internal electrode. A shape of the internal electrode may be defined by the non-conductive sub-portion NCP.

Next, referring to FIG. 3, a first method of manufacturing a thin film TL such as the one in FIG. 2 will be described.

Figure 3:
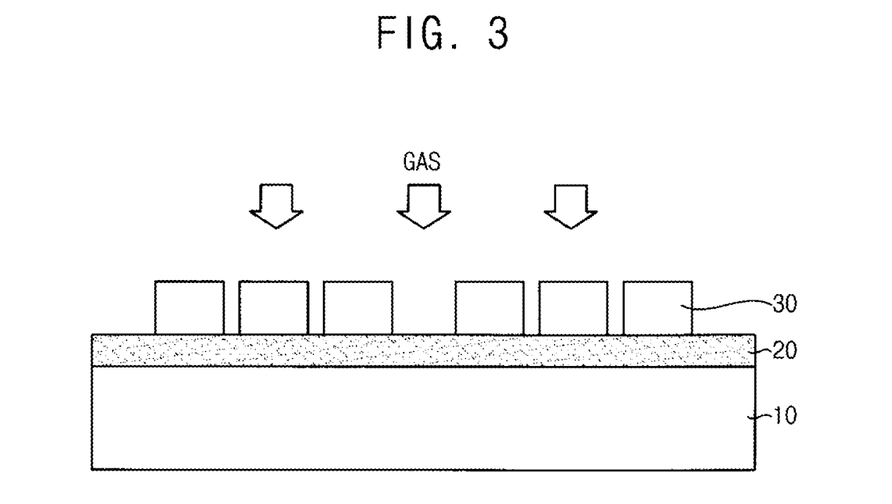
FIG. 3 is a cross-sectional view illustrating a first method of manufacturing the thin film shown in FIG. 2.

Referring to FIG. 3 and FIG. 2 together, an internally-undifferentiated (homogenous) and unitary transparent thin film layer 20 (TL') is formed on the base substrate 110. A patterned mask layer (a.k.a. photo pattern) 30 is formed on the transparent thin film layer 20.

The transparent thin film layer (TL') 20 includes the conductive fine-wires and a gas-semi-permeable, uncured version (not yet cross-polymerized version) of the binder. By gas-semi-permeable it is meant here that a reactive gas (to be detailed below) can permeate through the uncured version of the binder, but not at rapid rates such that the gas rapidly floods the interior volume of the uncured version of the binder. Rather the gas can enter from a top major surface of the uncured version of the binder and permeate vertically to the bottom within an appropriate time duration while not yet substantially permeating laterally in that time duration. By curable, it is meant for the case of FIG. 3 that the binder is dissolved in a selectively removable solvent (the solvent could be an aqueous one or an organic one) and when the solvent is removed with heat being applied or not above a predetermined temperature, the left behind resin of the binder cross-polymerizes and thus become solidified.

More specifically, a liquefied and not-yet cured or gas infused version of the material of the thin film including the fine-wires and the binder is sprayed on or otherwise coated on the base substrate 110 in an inert atmosphere (e.g., nitrogen). The material of the uncured thin film may be a conductive ink dissolved in a de-gassed solvent such as an aqueous solution and sprayed on as the combination of conductive fine-wires and uncured binder (resin plus solvent). Alternatively, the conductive ink may be printed on in roller type fashion on the base substrate 110.

The transparent thin film layer 20 is wholly formed on the base substrate 110 so as to include what will become the first boundary B1, the second boundary B2 and the third boundary B3. Thus, all the base substrate 110 is covered by the transparent thin layer 20.

The photo pattern 30 is formed within the first boundary B1 regions of the unitary thin film TL' 20. Thus, openings in the photo pattern 30 expose portions of the transparent thin layer 20 that will be within the second boundary B2 and within the third boundary B3.

Next, a reactive gas is supplied to the combination of the base substrate 10 formed with the photo pattern mask 30 through the mask openings so as to permeate into and react with the exposed portions of the transparent thin layer 20 and thereby form oxide(s), chloride(s) and/or fluoride(s) of the fine-wires vertically into those exposed regions but so as to not substantially permeate laterally and also react with laterally adjacent regions. Portions of the transparent thin layer 20 within the first boundary B1 are not contacted by or substantially permeated into and reacted with the gas due to action of the photo pattern 30 and the limited permeability of the uncured binder to the supplied reactive gas(es). The portions of the transparent thin layer 20 that define the second boundary B2 and the third boundary B3 are exposed by the photo pattern 30 thus make contact with and react with the gas. Thus, the transparent thin layer 20 of the second boundary B2 and the third boundary B3 are selectively reacted with the gas. If the gas includes oxygen, the reacting-therewith fine-wires may be oxidized such that non-conductive oxide versions of the fine-wires are formed. Differently, if the gas includes chlorine, non-conductive chloride versions of the fine-wires are formed. If the gas includes fluorine, the corresponding fluorides are formed. The gas may include a single reactive ingredient or the gas may be a mix of gases including at least one of an oxygen, chlorine and fluorine. The gas may be provided on the base substrate 10 for about from 10 seconds to about 70 seconds. Flow rates may be from 10 SCCM to 30 SCCM for $O_2$, from 10 SCCM to 30 SCCM for $Cl_2$ and from 10 SCCM to 30 SCCM for $F_2$.

Accordingly, those of the fine-wires that are disposed within the first boundary B1 are not reached by the slow permeating reactive gas(es) and thus not changed. An oxide of the fine-wires, a chloride of the fine-wires or a fluoride of the fine-wires is caused to be disposed only within the second boundary B2 and the third boundary B3.

Next, the selectively chemically modified transparent thin layer 20 is dried (its solvent is removed) and the left behind binder is cured (for example, due to above room temperature heat being simultaneously applied). The unmodified and thus still electrically conductive fine-wires, plus the oxidized and thus non-conductive fine-wires, and/or the chloridated and thus non-conductive fine-wires and/or the fluoridated and thus non-conductive fine-wires are thereby fixed onto the base substrate 10 by the cured binder. More specifically, in one embodiment, water is used as the solvent of the transparent thin layer 20 and in the drying process the water is removed from the base substrate 10. Thus, only the fine-wires, the oxides of the fine-wires, the chlorides of the fine-wires and/or the fluorides of the fine-wires remain on the base substrate 10 to thereby defined patterned conductive and patterned non-conductive regions. Some of the initial water may be removed during the gas application treatment from the transparent thin layer 20. A remaining majority of the water is removed in the drying process.

Once the solvent (e.g., water) is removed and the remaining binder is cured, and the photo pattern 30 is also removed, the thin film TL including the first patterned portion P11, the second patterned portion P21 and the third patterned portion P3 shown in FIG. 1 and FIG. 2 are formed. The solvent removing drying process may be performed both before and after the photo pattern 30 is removed.

As describe above, the transparent thin layer is patterned into conductive portions and into non-conductive portions without need for physically etching the film 20. Thus the skewing and/or delaminating problems associated with etching are avoided. Also the time and expense of etching are avoided. Thus, the unitary thin film layer TL having the first patterned portion P11, the second patterned portion P21 and the third patterned portion P3 may be formed without etching of the surface of the thin film layer TL.

Alternatively or additionally to chemical modification by selective exposure to reactive gas(es), the reaction with the reactive gas(es) and/or the solvent drying process may be accelerated by selectively subjecting the to-be-reacted and/or he to-be-first dried regions of the thin film layer to a laser beam. In some cases it may also be desirable to selectively ablate portions of the transparent thin layer 20 using the laser. More specifically, in one embodiment, the non-conductive sub-portions NCP are formed (cured) first during the patterning process of the transparent thin layer 20. The first-formed NCP sub-portions then operate as dams that block permeation of wanted gasses into the not-yet-cured transparent portions TP. Thus, pollution of the transparent electrode patterned portion TP may be originally prevented.

In one embodiment, the respective optical transmittance and/or respective reflectivity of the transparent electrode patterned portions TP and the non-conductive sub-portions NCP are substantially the same. Thus, when used for displaying an image as in a display apparatus, the shapes of the transparent electrode patterns are not readily viewable by a user.

Figure 4:
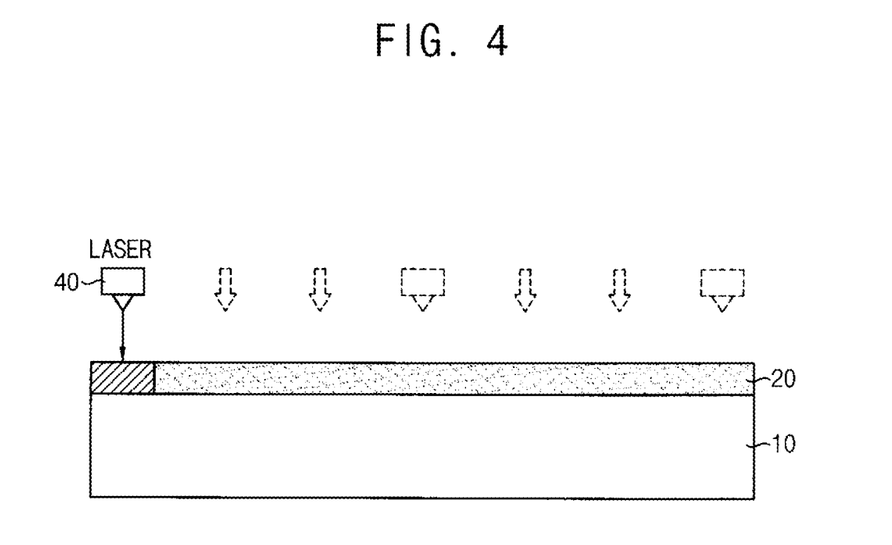
FIG. 4 is a cross-sectional view illustrating another method of manufacturing the thin film shown in FIG. 2.

FIG. 4 is a cross-sectional view illustrating another method of manufacturing the thin film shown in FIG. 2.

FIG. 4 referring with FIG. 1 and FIG. 2, the base substrate 10 and the transparent thin layer 20 are formed. The differentiation of the transparent thin layer 20 into having the second boundary B2 and the third boundary B3 as well as optionally later, the first boundary B1 is at least partially provided for by using an aimable laser apparatus 40. A wavelength of the laser apparatus 40 may be from about 330 nm to about 500 nm, and unit of a pulse length of the laser is one Pico second. A pulsed laser having the given range of the wavelengths is preferable so as to not give adverse affect to conductivity of the fine-wires of the first boundary B1, while the fine-wires of the second boundary B2 and the third boundary B3 may be easily oxidized.

The transparent thin layer 20 of the second boundary B2 and the third boundary B3 are first selectively provided with the laser energy so that the fine-wires therein are selectively oxidized by the laser. Namely, the fine-wires of the transparent thin layer 20 are oxidized by reaction with ambient or otherwise provided oxygen in combination with the focused energy of the laser. Thus, an oxide of the fine-wires remains in the second boundary B2 and the third boundary B3 is formed. By scanning the laser apparatus 40 as an example, various boundaries for the non-conductive and conductive regions within the transparent thin film layer 20 may be provided. Thus, without addition of a mask, the transparent thin layer 20 may be partitioned into having the non-conductive second boundary B2 and the non-conductive third boundary B3 while still having the conductive first boundary B1. fine-wires After forming the non-conductive sub-portion NCP in the second boundary B2 and the third boundary B3, a water of the transparent thin layer 20 is dried, and the binder in the first boundary B1 is thereby cured so as to affix (bind) the fine-wires on the base substrate 10. Thus, the transparent electrode patterned portion TP including the fine-wires and the cured binder is formed. At the same time the binder in the second boundary B2 and in the third boundary B3 affixes the formed oxides thereof (oxides of the fine-wires) on the base substrate 10. Thus, the non-conductive sub-portion NCP including the non-conductive oxides of the fine-wires and the binder is formed.

As describe above, the transparent thin film layer 20 may be modified into having differentiated, transparent conductive sections and non-conductive sections without relying on physical etching through that the transparent thin film layer 20. Instead the unitary thin film layer 20 is partially oxidized by selectively using a laser and a condition where the to-be-oxidized fine-wires are exposed to an oxidizing agent (e.g., H2O), where the non-conductive sub-portions NCP are formed in desired patterns by selectively using the laser 40 to induce selective oxidation. In other words, because of using the laser apparatus 40, there is no need to form a photo pattern used as mask to prevent an oxidation of the transparent thin layer 20 in the first boundary B1. Thus, process of forming the thin film TL may be simplified.

Figure 5:
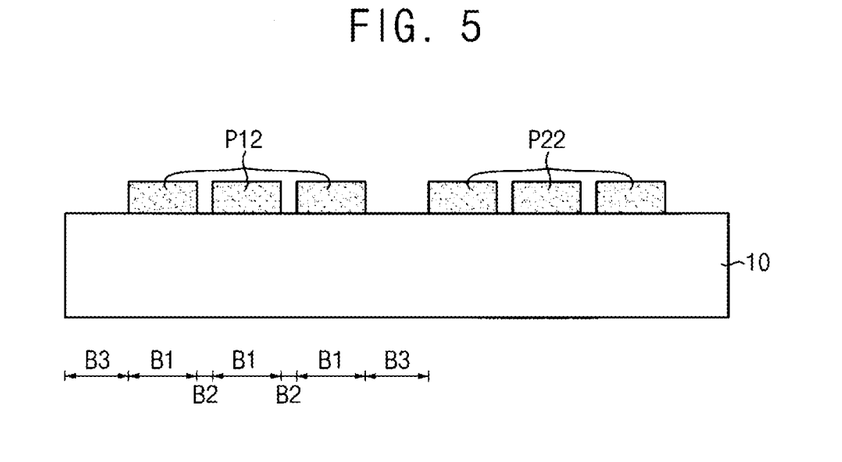
FIG. 5 is a cross-sectional view illustrating a thin film according to another example embodiment of the present disclosure.

FIG. 5 is a cross-sectional view illustrating a thin film according to another example embodiment of the present disclosure of invention.

Referring to FIG. 5, a unitary thin film formed on a base substrate 10 is patterned by selective laser ablation so as to include the first patterned portion P11a and the second patterned portion P12a. The first patterned portion P11a and the second patterned portion P12a are spaced from each other in areas where the selective laser ablation has removed material of the original and blanket deposited unitary thin film. The left-behind first patterned portion P11a is substantially in a same plane as a transparent electrode patterned portion TP including an internal electrode and an external electrode of a corresponding first patterned portion P11 shown in FIG. 1. The second patterned portion P12a is substantially in the same plane as a transparent electrode patterned portion TP including an internal electrode and an external electrode of a corresponding second patterned portion P12 shown in FIG. 1. Differently a thin film shown in FIG. 1 and FIG. 2, a thin film in FIG. 5 may include the first patterned portion P11a and the second patterned portion P12a disposed in the first boundary B1 of the base substrate 10. The base substrate 10 between the second boundary B2 and the third boundary B3 may be exposed outwardly. The second boundary B2 and the third boundary B3 is disposed between the patterns which are at least partially spaced from each other.

The first patterned portion P11a and the second patterned portion P12a may include conductive fine-wires and a cured polymer which fixes the fine-wires on the base substrate 10. The fine-wires may include silver (Ag) or copper (Cu). The polymer may be formed by curing reaction of a photosensitive compound.

A transmittance of the first patterned portion P11a and the second patterned portion P12a may be from about 85% to about 95% with respect to a light having a wavelength of about 550 nm. Transmittance of the first patterned portion P11a and the second patterned portion P12a is related to a density of the fine-wires therein. If the transmittance in less than about 85%, the transmittance may be substantially not adequate for use as a transparent electrode in an image displaying device. By characteristics without the fine-wires being present, a transmittance of the first patterned portion P11a and the second patterned portion P12a may be about 95% or higher. With the conductive fine-wires in place, a surface resistance of the first patterned portion P11a and second patterned portion P12a may be from about 15 ohm/square ($\Omega/\square$) to about 110 ohm/square ($\Omega/\square$) for use as a transparent conductive electrode.

Figure 6A:
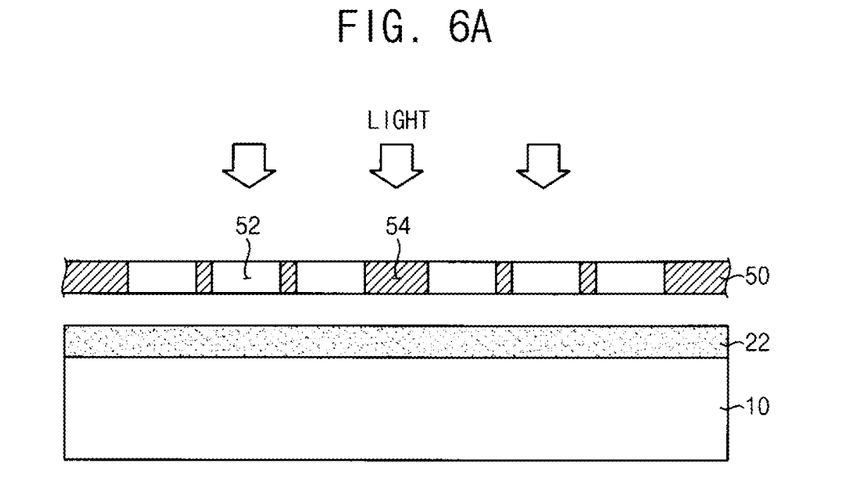
FIGS. 6A and 6B are cross-sectional views illustrating a method of manufacturing a thin film such as one shown in FIG. 5.
Figure 6B:
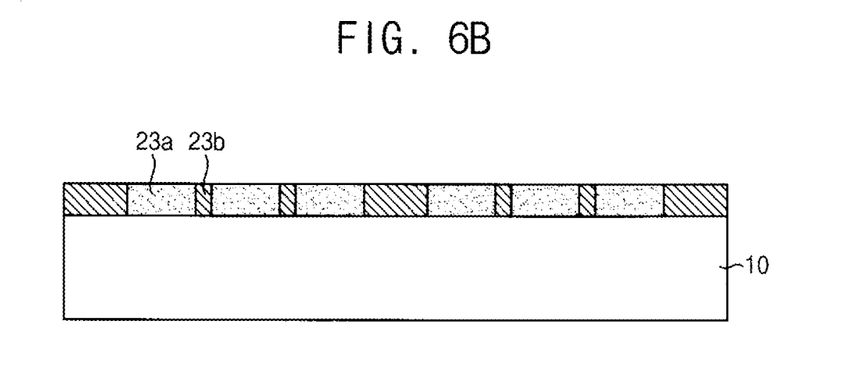

Next, referring to FIG. 6A and FIG. 6B, a method of manufacturing the thin film including the first patterned portion P12 and the second patterned portion P22 shown in FIG. 5 is illustrated.

FIGS. 6A and 6B are cross-sectional views illustrating a method of manufacturing a patterned thin film such as one shown in FIG. 5 for example will be explained.

Referring to FIG. 6A, a homogeneous (not yet differentiated) and uniform transparent thin film layer 22 is formed on the base substrate 10. A photomask 50 is disposed at the top portion of the base substrate 10 on which the homogeneous (not yet differentiated) and uniform transparent thin film layer 22 is disposed. The transparent thin film layer 22 includes conductive fine-wires and may be formed by spraying a polymer precursor composition on the base substrate 10. The polymer precursor composition may include a mono-functional monomer, a dual-functional monomer, a multi-functional monomer, a photo initiator and an extra solvent. The multi-functional monomer is defined as a monomer including functional monomers of function number more than 3. Because the polymer precursor composition includes a variety of different kinds of cross-polymerizable monomers stably and uniformly dispersed in the solvent, the polymer precursor composition may be uniformly sprayed on the base substrate 10. Using of the polymer precursor composition compare with using of a resin form of polymer as substance of forming the transparent thin layer 22, the transparent thin layer 22 may be uniformly formed on the base substrate 10.

Specific examples of the mono-functional monomers are: allyl methacrylate, behenyl acrylate, butyl acrylate, tert-butyl acrylate, tert-butyl methacrylate, tert-butylaminoethyl methacrylate, ethyl acrylate, ethyldiglycol acrylate, 2-ethylhexyl acrylate, hexyl acrylate, 4-hydroxybutyl acrylate, 2-hydroxyethyl acrylate, hydroxypropyl acrylate, isobutyl acrylate, isodecyl acrylate, lauryl acrylate, methyl acrylate, 2-propylheptyl acrylate or stearyl acrylate, etc. These can be used alone or in various combinations thereof.

Specific examples of dual-functional monomers are: triethylene glycol dimethacrylate, diethylene glycol dimethacrylate, 1,4-butanediol dimethacrylate, 1,4-butanediol diacrylate or ethylene glycol dimethacrylate, etc. These can be used alone or in a combination thereof.

Specific examples of the multi-functional monomers are: di(trimethylpropane), tetraacrylate, dipentaerythritol hexaacrylate, dipentaerythritol pentacarylate or pentaerythritol tetraacrylate, etc. These can be used alone or in a combination thereof.

Specifically examples of the photo initiator are: 2-Benzyl-2-(dimethylamino)-1-[4-(4-morpholinyl)phenyl]-1-butanone, 2-Methyl-1-[4-(methylthio)phenyl]-2-(4-morpholinyl)-1-propanone, etc. These can be used alone or in a combination thereof.

The polymer precursor composition may include the following: a mono-functional monomer of about 10 weight % to about 20 weight % with respect to a total weight of the polymer precursor composition, a dual-functional monomer of about 20 weight % to about 60 weight % with respect to the total weight of the polymer precursor composition, a multi-functional monomer of about 10 weight % to about 30 weight % with respect to the total weight of the polymer precursor composition, a photo initiator of about 3 weight % to about 5 weight % with respect to the total weight of the polymer precursor composition and an extra solvent. When included in each of the given ranges of weight, the uniform dispersibility within the solvent of the monomers may be optimized. The photo initiator is activated by a light. Thus, a chemical reaction (cross polymerization) of the monomers may be maximized. Accordingly, even though the transparent thin layer is developed (cured) by use of light activation (e.g., laser activation), portions of the transparent thin layer 22 that remain as unexposed areas can be selectively removed from the base substrate 10 by rinsing or otherwise to thereby leave behind the structure shown in FIG. 5. The transparent thin layer 22 of the selectively exposed (and thus cured) areas may stably remain on the base substrate 10.

When a content of the photo initiator is less than 3% weight, the light exposure process for appropriate curing tends to be longer. Also, some portion of the monomer content may remain on the base substrate 10. Also, when content of the photo initiator is over 5% weight, the monomers of the unexposed areas may partially react with one another due to action of the photo initiator alone (without presence of light), the transparent thin layer 22 of the unexposed area may undesirably remain. Thus, a reliability of manufacturing the first patterned portion P11a and the second patterned portion P12a of FIG. 5 may be lowered. Thus, the content of photo initiator from about 3% to about 5% is desirable.

In addition, the polymer precursor composition may include a cross-linking agent, an antioxidant, etc. The cross-linking agent is included in a range amount not affecting to a content of the monomer in the polymer precursor composition. Namely, the cross-linking agent may include from about 0% weight to about 1% weight. Also, the antioxidant may include from about 0% weight to about 1% weight.

The photomask 50 may include a portion of transmitting 52 and a portion of shading 54. The portion of transmitting light therethrough 52 is disposed in the first boundary B1 of the base substrate 10. The portion of shading is disposed in the second boundary B2 and the third boundary B3 of the base substrate 10. A light above the mask 50 is provided toward the base substrate 10 to thereby cure the exposed areas.

Referring to FIG. 6B, the transparent thin layer 22 in the first boundary B1 is exposed, the photo initiator is activated. Thus, the monomers in the first boundary B1 participate in a chemical polymerization reaction and the binder polymer is formed. Namely a cured patterned portion 23a including the conductive fine-wires and the polymer is formed in the first boundary B1. A uncured patterned portion 23B including the fine-wires and the nonpolymerized monomers remain as selectively removable material in the second boundary B2 and the third boundary B3.

Next, by selectively removing the uncured patterned portion 23b using a developer, only the cured patterned portion 23a remains bound to and on the base substrate 10. The cured patterned portion 23a remaining on the base substrate 10 may be the first patterned portion P11a and the second patterned portion P12a shown in FIG. 5.

As describe above, without additional use of an etch mask for etch-wise patterning a thin layer, the transparent thin layer 22 is instead formed by means of selective photo-initiated curing of some areas but not others of the fine-wires containing, polymer precursor composition. By this it is meant that areas exposed to light are developed, and the first patterned portion P11a and the second patterned portion P12a may be easily formed. Especially because of using the polymer precursor composition at state of sprayed monomers and not longer-chained polymers in the solvent, the coatability or other applicability of the polymer precursor composition to the substrate compares well with other cases of forming the transparent thin layer 22 mixed the fine-wires and generally photo resist composition including a binder resin of polymer, relatively the transparent thin layer 22 is uniformly formed in large area.

Figure 7:
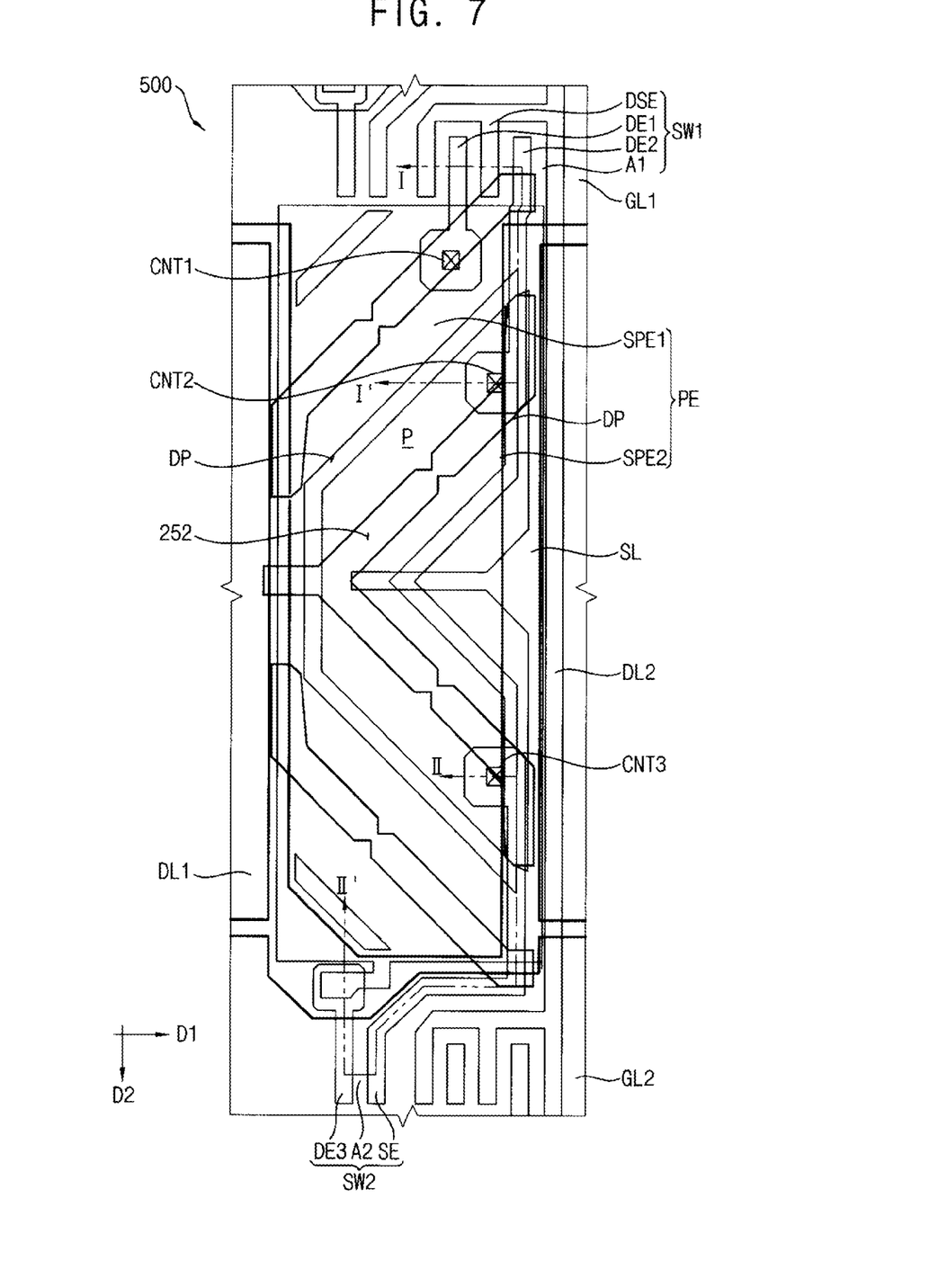
FIG. 7 is a plan view illustrating a display panel including a thin-film transistor substrate according to another example embodiment of the present disclosure of invention.

FIG. 7 is a top plan view illustrating a display panel including a thin-film transistor substrate according to another example embodiment of the present disclosure of invention.

Figure 8:
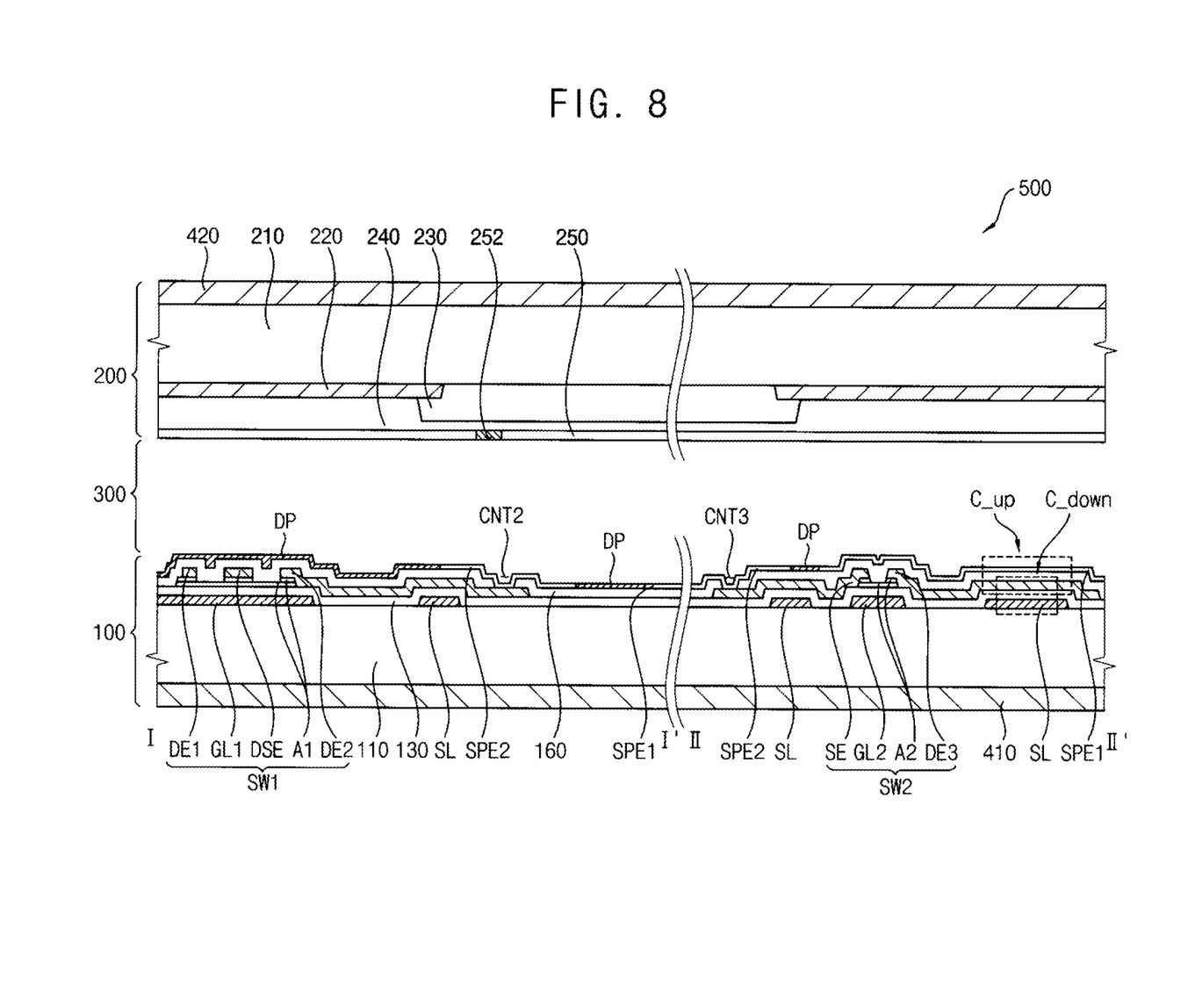
FIG. 8 is a cross-sectional view cut along a line I-I' and a line II-II' shown in FIG. 7.

Referring to FIG. 7 and FIG. 8, a display panel 500 includes a first gate line GL1 and a second gate line GL2, a first data line DL1, a second data line DL2, a first switching device SW1, a pixel electrode including a first non-conductive sub-portion DP included as part of its layered make up, a second switching device SW2, a storage line SL and a common electrode 250 including a second non-conductive sub-portion 252 included as a respective part of its layered make up. In other words, where heretofore so-called, slitted pixel-electrodes and/or slitted common electrodes were formed by selectively etching through the respective material layer in which the slitted pixel-electrode and/or the slitted common electrode was respectively formed, the present disclosure of invention allows for patterning into conductive regions of desired shape and interposed non-conductive regions of desired shape without use of etching through the respective material layer of the so-patterned transparent electrode. Accordingly, a delamination problem is avoided or reduced and more reliable display devices (e.g., Liquid Crystal Displays (LCD's)) are provided.

The components of the illustrative display device of FIG. 7; except for the specially-formed common electrode 250 and the specially-formed pixel-electrodes may be conventional ones. While the non-etched pixel-electrode patterns are formed on a first base substrate 110 the common electrode, if it too is non-etch-wise patterned; is formed on the spaced apart second substrate 200. More specifically, the first base substrate 110 serves as a light-passing base of a thin-film transistors supporting substrate 100 of the display panel 500. The common electrode 250 is formed on a light-passing second base substrate 210 of the opposingly spaced apart second substrate 200. The second base substrate 210 of the opposing substrate 200 is opposite to the first base substrate 110.

The first and second gate lines, GL1 and GL2 are extended in a first direction D1 of the display panel 500. The first and second data lines DL1 and DL2 are disposed to be extended in a second direction D2 orthogonal with the first direction D1. The first direction D1 and the second direction D2 may be perpendicular to each other.

The first switching device SW1 is connected with the first gate line GL1 and the second data line DL2. The first switching device SW1 is turned off or on by a first gate signal applied in the first gate line GL1. The first switching device is electrically connected with the pixel electrode PE.

The first switching device SW1 includes a dual-source electrode DSE overlapped with the first gate line GL1, a first drain electrode DE1 and a second drain electrode DE2. For example, the dual-source electrode DSE may be formed as having a W-shape. The first drain electrode DE1 and the second drain electrode DE2 are spaced apart from each other in the place where the dual-sourced (e.g., W-shaped) electrode DSE is formed. The first drain electrode DE1 and the second drain electrode DE2 respectively electrically connect to different parts of the patterned pixel electrode PE so as to apply different drive voltages to those parts (to the respective sub-pixels).

A patterned first active layer portion A1 (e.g., semiconductive island) is disposed between the dual-source electrode DSE and the first drain electrode DE1. The first active layer portion A1 is disposed between the dual-source electrode DSE and the second drain electrode DE2. When the first switching device SW1 is turned on, the first drain electrode DE1 and the second drain electrode DE2 are respective electrically coupled to a drive voltage presented on the dual-source electrode DSE by way of respective tuned-on channels defined in the patterned first active layer portion A1. Thus, a data signal applied to the second data line DL2 may be differently or same wise respectively transmitted to the first drain electrode DE1 and to the second drain electrode DE2 depending on how the first active layer portion A1 is patterned.

In the illustrated example of FIG. 7 there are two pixel electrodes PE, where the second pixel-electrode is driven by data voltages supplied on the first data line DL1 and selectively passed through the second switching device SW2. Each of the first and second pixel electrodes PE may be formed in an area sandwiched by the first and second data lines DL1 and DL2 and also sandwiched by the first and second gate lines GL1 and GL2. The area filled by the first and second pixel electrodes PE may be defined as a pixel area P (or aperture area) of the display panel 500. The pixel area P substantially may be a rectangle shape when viewed from a top plan view. The pixel electrode PE includes a first sub-electrode SPE1, a second sub-electrode SPE2 and the first non-conductive sub-portion DP. The first sub-electrode SPE1 and the second sub-electrode SPE2 include conductive fine-wires. The first non-conductive sub-portion DP may include, in accordance with a respective embodiment, at least one of a non-conductive oxidized version of the fine-wires, a non-conductive chloridated version of the fine-wires and/or a non-conductive fluoridated version of the fine-wires. The conductive fine-wires, the oxide of the fine-wires, the chloride of the fine-wires and/or the fluoride of the fine-wires may be fixed on the first base substrate 110 by a binder. The first sub-electrode SPE1 and the second sub-electrode SPE2 may be electrically separated from one another by the first non-conductive sub-portion DP. The first non-conductive sub-portion DP corresponds to the non-conductive sub-portion NCP in FIG. 1 and in FIG. 2. The first sub-electrode SPE1 and the second sub-electrode SPE2 respectively and substantially correspond to the transparent electrode patterned portions TP in FIG. 1 and FIG. 2. Thus, overlapping description will be omitted.

The first non-conductive sub-portion DP is formed in a diagonal direction of the first gate line GL 1 and the second gate line GL2 in the pixel area P. The first non-conductive sub-portion DP is extended in a direction between the first direction D1 and the second direction D2. For example, a tilt of the first non-conductive sub-portion DP with the first gate line GL1 and the second gate line GL2, the first data line DL1 and the second data line DL2 is about 45°. Thus, may be extended in the direction between the first and second directions D1 and D2. The first non-conductive sub-portion DP may be formed as a V-shaped slit area or a U-shaped one crossing two diagonal inclined to different direction each other.

The first sub-electrode SPE1 may be formed to wrap around but be spaced apart from the second sub-electrode SPE2. Dimensionally, the first non-conductive sub-portion DP directly contacts with the first sub-electrode SPE1, the first sub-electrode SPE1 is wrapped. The second sub-electrode SPE2 is disposed to wrap the first non-conductive sub-portion DP. The first sub-electrode SPE1 contacts with the first drain electrode DE1 through a first contact hole. The second sub-electrode SPE2 contacts with the second drain electrode DE2 through a second contact hole. Thus, the first sub-electrode SPE1 and the second sub-electrode SPE2 are electrically connected with the first switching device SW1.

A down voltage capacitor C_down is defined by the storage line SL and the third drain electrode DE3. An up voltage capacitor C_up is defined by the third drain electrode DE3 and the first sub-electrode SPE1.

In addition, a voltage charged to the first sub-electrode SPE1 is defined as a first voltage. A voltage charged to the second sub-electrode SPE2 is defined as a second voltage. A process of applying different respective voltages to the first sub-electrode and the second sub-electrode is simply illustrated. Because the first sub-electrode SPE1 and the second sub-electrode SPE2 are electrically separated to each other by the first non-conductive sub-portion DP, the first sub-electrode SPE1 and the second sub-electrode SPE2 may be applied each of different voltage through respective channels of the first switching device SW1.

First of all, applied the first gate signal in the first gate line GL1, the first voltage of the first sub-electrode SEP1 and the second voltage of the second sub-electrode SEP2 have a same value, after gradually are increased. Continuously, when the first gate signal in the first gate line GL1 disappear, the first voltage of the first sub-electrode SPE1 and the second voltage of the second sub-electrode SPE2 have a same value, after gradually are decreased and constantly are maintained. Subsequently, applied the second gate signal in the second gate line GL2, the first voltage of the first sub-electrode SPE1 is gradually increased and constantly is maintained. On the other hand the second voltage of the second sub-electrode SPE2, there is slight changes. But almost the second voltage of the second sub-electrode SPE2 may have a same value before applied the second gate signal. Finally when the second gate signal in the second gate line GL2 disappear, the first voltage of the first sub-electrode SPE1 and the second voltage of the second sub-electrode SPE2 are constantly maintained as different value. After all this, the first voltage of the first sub-electrode SPE1 has relatively a higher value than the second voltage of the second sub-electrode SPE2. Namely, although a same drive voltage is applied for transmittance to the first sub-electrode SPE1 and the second sub-electrode SPE2 by the first switching device SW1, the first voltage of the first sub-electrode SPE1 is pumped up in one embodiment by action of the second switching device SW2. Thus, in the first sub-electrode SPE1 and the second sub-electrode SPE2 develop different voltages.

In cross-sectional, the thin-film transistor substrate 100 may further include a gate insulating layer 130 formed on the first base substrate 110 and a passivation layer 160. The gate insulating layer 130 is formed to cover the first gate line GL1, the second gate line GL2 and the storage line SL. The passivation layer 160 is formed to cover the first data line DL1, the second data line DL2, the first drain electrode DE1, the second drain electrode DE2, the third drain electrode DE3, the dual-source electrode DSE and the source electrode SE. The pixel electrode PE is formed on the passivation layer 160.

The opposing substrate 200 includes a shading pattern 220 formed on the second base substrate 210, a color filter layer 230, an overcoating layer 240 and the common electrode 250. The common electrode may include the second non-conductive sub-portion 252 and a conductive electrode pattern which substantially serves as an electrode. The electrode pattern may include the conductive fine-wires and the binder. The second non-conductive sub-portion 252 may include a non-conductive oxide of the fine-wires, a chloride of the fine-wires and/or a fluoride of the fine-wires and the binder.

The second non-conductive sub-portion 252 is disposed crisscross with the first non-conductive sub-portion DP. The liquid crystal domain may be formed with the first non-conductive sub-portion DP. The second non-conductive sub-portion 252 may include a V-shaped pattern and the V-shaped pattern that surrounds the outer diagonal pattern. The diagonal type pattern is spaced apart from the V-shaped pattern. An area between the V-shaped pattern and the diagonal pattern may be disposed the first non-conductive sub-portion DP.

The display panel 500 may further include a first polarizing plate 410 disposed outside of the thin-film transistor substrate 100 and a second polarizing plate 420 disposed outside of the opposing substrate 200.

Figure 9:
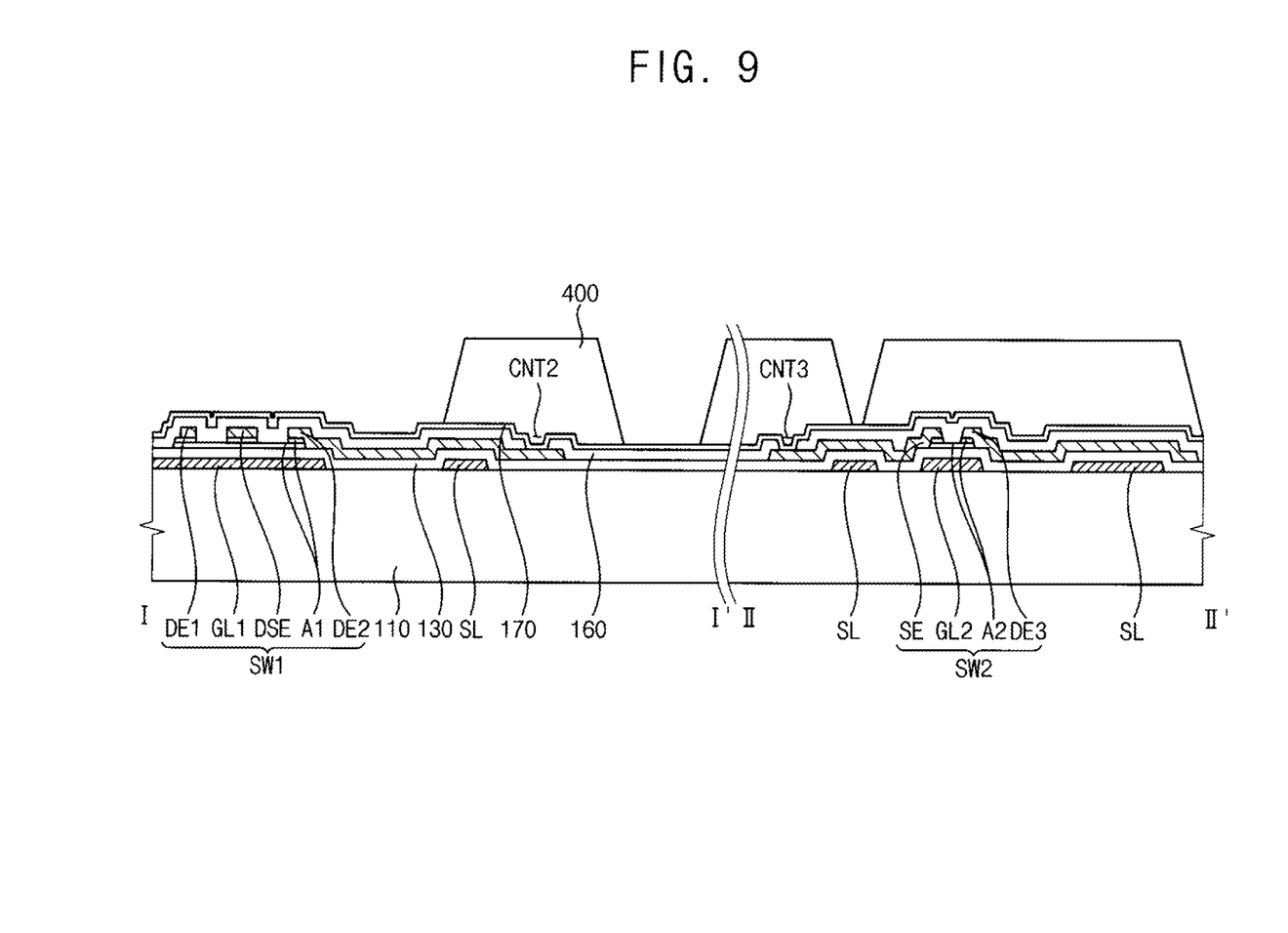
FIG. 9 is a cross-sectional view illustrating a method of manufacturing the thin-film transistor substrate shown in FIG. 7.

FIG. 9 is a cross-sectional view illustrating a method of manufacturing the thin-film transistor substrate shown in FIG. 7.

Referring to FIG. 9, the first gate line GL1, the second gate line GL2 and the storage line SL are formed on the first base substrate 110. The gate insulating layer 130 is formed on the first base substrate 110 formed the first gate line GL1, the second gate line GL2 and the storage line SL. Next, the active pattern A1 partially piled with the first gate line GL1 and the second gate line GL2 is formed. And the second active pattern A2 is formed. The first data line DL1, the second data line DL2, the first drain electrode DE1, the second drain electrode DE2, the third drain electrode DE, the dual-source electrode DSE and the source electrode SE are next formed on the first base substrate 110 formed the first active pattern A1 and the second active pattern A2, and the passivation layer 160 is formed on top of that.

The first contact hole CNT1 and the second contact hole CNT2 are formed in the passivation layer 160, and a unitary and homogenous transparent thin film layer 170 is formed on top of that. The transparent thin film layer 170 is formed on the first base substrate 110 as a whole. The transparent thin layer 170 includes the conductive fine-wires and the binder. The transparent thin layer 170 is substantially same as the transparent thin film layer 20 illustrated in FIG. 3. Therefore, detail description is omitted.

A photo pattern 400 (e.g., patterned photoresist) is formed on the first base substrate 110 formed the transparent thin layer 170. In one embodiment, a reactive gas is provided on the first base substrate 110 formed the photo pattern 400, the transparent thin layer 170 of an area not covered to the photo pattern 400 is oxidized, chlorinated and/or fluoridated. Thus, the first non-conductive sub-portion DP may be integrally formed in the transparent thin film layer 170 without etching through the transparent thin film layer 170. According to formed the first non-conductive sub-portion DP, The transparent thin layer 170 covered to the photo pattern 400 may be defined as the first sub-electrode SPE1 and the second sub-electrode SPE2.

Alternatively, the transparent thin layer 170 without the photo pattern 400 using a laser is selectively oxidized. Thus, the first non-conductive sub-portion may be formed. A wavelength of the laser is from 330 nm to 500 nm, the laser may be a pulse laser, and unit of a pulse length of the pulse laser is Pico second.

In addition, referring to FIG. 8, a method of manufacturing the opposing substrate 200 is similarly illustrated. The shading pattern 220, the color filter layer 230 and the overcoating layer 240 are methodically formed on the second base substrate 210. A transparent thin film layer is formed on the overcoating layer 240. The transparent thin layer includes the conductive fine-wires and the binder. A photo pattern (not shown) is formed on the transparent thin layer. Using the photo pattern as mask, the transparent thin layer is oxidized, chlorinated or fluoridated. Thus, the common electrode 250 including the second non-conductive sub-portion 252 is formed without etching through the transparent thin film layer of the common electrode 250. An area formed the photo pattern is substantially an electrode. The transparent thin film exposed by the photo pattern is changed as the second non-conductive sub-portion 252. Thus, the patterned common electrode 250 may be formed.

As describe above, by the pixel electrode PE including the first non-conductive sub-portion DP, the first sub-electrode SPE1 and the second sub-electrode SPE2, the layer of the pixel electrode PE may wholly cover to the first base substrate 110 formed with the passivation layer 160 and stick to it (adhere to it, bind to it) as a whole to thereby substantially reduce the danger of delamination. Since the pixel electrode layer is not patterned (differentiated) by means of etching there through, there is essentially no undercutting into the binding interface between the pixel electrode layer and the layer beneath it (e.g., the passivation layer 160) so that a risk of disconnection is prevented. Optical reflectivity of the first non-conductive sub-portion DP is substantially the same as that of the first sub-electrode SPE1 and the second sub-electrode SPE2, so that the shapes of the first non-conductive sub-portion DP may not viewed by a viewer when place for example in bright light. Also, by using the common electrode 250 including the second non-conductive sub-portion 252, a manufacturing reliability of the common electrode 250 is similarly improved.

The first non-conductive sub-portion DP (not shown) and the second non-conductive sub-portion 252 (not shown) in FIG. 7 and FIG. 8 may be open pattern. For example, the pixel electrode PE may include the opening pattern spaced apart the first sub-electrode SPE1 and the second sub-electrode SPE2 and exposed to the passivation layer 160 of an area formed the first non-conductive sub-portion DP and the second non-conductive sub-portion 252. At this time, the pixel electrode PE may form the transparent thin layer including the conductive fine-wires and the polymer precursor composition. The pixel electrode PE may be formed by exposure and develop of the transparent thin layer. Forming the pixel electrode PE used the transparent thin layer including the fine-wires and the polymer precursor composition is same as illustrated in FIG. 6A and FIG. 6B. Identically the common electrode may be formed by exposure and develop of the transparent thin layer including the fine-wires and the polymer precursor composition. Thus, overlap description will be omitted.

By describe above, the non-conductive sub-portion is formed on a portion for disconnecting from the remainder of the originally-homogeneous transparent thin layer including fine-wires, so that the transparent electrode pattern without etching through so that the left behind parts have a stable (not undercut) structure. That is, the transparent electrode is not patterned by way of etching through its surface, so that a risk of disconnection is prevented and the transparent thin layer is easily patterned. Also, in the case where the non-conductive sub-portion is not removed from the substrate, and the non-conductive sub-portion may be formed by a chemical pattern using a chemical reaction of the fine-wires. Thus all the substrate area may be covered with the transparent electrode pattern(s) or the non-conductive sub-portion(s). Therefore, reflectivity of the transparent electrode pattern(s) is/are substantially the same as that of the non-conductive sub-portion (s), so that the shape of the transparent electrode pattern may not viewed by a viewer.

Also, the nonconductor pixel is defined as a locally chemically modified pattern. Thus, pollution of the transparent electrode pattern caused by residual particle may be prevented. Such residual particles may be created during forming the thin film using a destructive process such as laser ablation.

In addition, when the transparent thin layer includes polymer precursor composition reacting by a light, the transparent thin layer may be patterned without any additional photo pattern for an etch stop layer. Thus, manufacturing process may be simplified. Furthermore, length of etching skew (e.g., undercut) of the transparent electrode pattern may be minimized.

The foregoing is illustrative of the present disclosure of invention and is not to be construed as limiting thereof.

Although a few example embodiments in accordance with the present teachings have been described, those skilled in the art will readily appreciate in view of the foregoing that many modifications are possible in the example embodiments without materially departing from the novel teachings and advantages of the present disclosure. Accordingly, all such modifications are intended to be included within the spirit and scope of the present teachings. In the claims, means-plus-function clauses are intended to cover the structures described herein as performing the recited function and not only structural equivalents but also functionally equivalent structures. Therefore, it is to be understood that the foregoing is illustrative of the present teachings and is not to be construed as limited to the specific example embodiments disclosed, and that modifications to the disclosed example embodiments, as well as other example embodiments, are intended to be included within the scope of the teachings.

What is claimed is:

1. A thin film disposed as a layer on a substrate, the thin film comprising:
    a patterned transparent electrode portion comprised of a plurality of conductive fine-wires; and
    a patterned non-conductive sub-portion disposed in the same layer as that of the patterned transparent electrode portion, the non-conductive sub-portion including at least one member selected from the group of non-conductive fine-wires consisting of oxidized fine-wires, chloridated fine-wires and fluoridated fine-wires.

2. The thin film of claim 1, wherein the conductive fine-wires comprise at least one of silver-containing fine-wires and copper-containing fine-wires.

3. The thin film of claim 1, wherein an optical transmittance efficiency of the transparent electrode portion is in a range from about 85% to about 95% with respect to a light having a wavelength of about 550 nm.

4. The thin film of claim 1, wherein a surface resistivity of the transparent electrode pattern is from about $15\Omega/\square$ (ohms per square) to about $110\Omega/\square$, and a surface resistance of the non-conductive sub-portion is greater than about $1\ M\Omega/\square$.

5. The thin film of claim 1, wherein the electrode pattern is in physical contact with the non-conductive sub-portion.

6. A method of patterning a thin film, the method comprising:
    forming a homogenous and transparent thin layer having conductive fine-wires on a substrate; and
    converting a portion of the formed and homogenous transparent thin layer into a non-conductive sub-portion having a desired pattern where the non-conductive sub-portion includes at least one member selected from the group of non-conductive fine-wires consisting of oxidized fine-wires, chloridated fine-wires and fluoridated fine-wires.

7. The method of claim 6, wherein the conversion which forms the non-conductive sub-portion comprises:
    forming a gas impermeable and patterned mask that protects at least a first area of the transparent thin layer from being subjected to a corresponding gas; and
    providing as the corresponding gas, a reactive gas to a second area of the transparent thin layer not protected by the gas impermeable and patterned mask, where the reactive gas chemically modifies the fine-wires of the second area into becoming non-conductive fine-wires.

8. The method of claim 6, wherein the conversion which forms the non-conductive sub-portion includes:
    selectively irradiating portions of the transparent thin layer with a laserfine-wires.

9. The method of claim 8, wherein a wavelength of the laser is from about 330 nm to about 500 nm, and the laser radiation is a pulsed one in which a unit of a pulse length of the laser is about one Pico second.

10. A method of forming a patterned thin film, the method comprising:
    forming on a substrate, a homogenous and transparent thin film layer having conductive fine-wires mixed with a liquid polymer precursor composition;
    forming a light blocking and patterned mask that protects at least a first area of the transparent thin layer from exposure to a precursor curing light;
    irradiating a precursor curing light onto a second portion of the transparent thin layer not protected by the patterned mask; and
    selectively removing from the exposed transparent thin layer, the uncured mixture of conductive fine-wires and the polymer precursor composition of the second area.

11. The method of claim 10, wherein the polymer precursor composition comprises:
    a mono-functional monomer of about 10 weight % to about 20 weight % with respect to a total weight of the polymer precursor composition;
    a dual-functional monomer of about 20 weight % to about 60 weight % with respect to the total weight of the polymer precursor composition;
    a multi-functional monomer of about 10 weight % to about 30 weight % with respect to the total weight of the polymer precursor composition;
    a photo initiator of about 3 weight % to about 5 weight % with respect to the total weight of the polymer precursor composition; and
    a solvent whose weight is not counted as part of said total weight of the polymer precursor composition.

12. A thin-film transistor array substrate comprising:
    a gate line formed on a base substrate;
    a data line extended in a direction crossing the gate line;
    a thin-film transistor connected to the gate line and the data line; and
    a pixel electrode including:
        a transparent electrode pattern formed in a layer and having conductive fine-wires; and
        a non-conductive sub-portion disposed in the same layer as the transparent electrode pattern, the non-conductive sub-portion including at least one member selected from the group of non-conductive fine-wires consisting of oxidized fine-wires, chloridated fine-wires or fluoridated fine-wires.

13. The thin-film transistor substrate of claim 12, wherein the conductive fine-wires comprise at least one of silver and copper.

14. The thin-film transistor substrate of claim 12, wherein an optical transmittance efficiency of the transparent electrode pattern is from about 85% to about 95% with respect to a light having a wavelength of about 550 nm.

15. The thin-film transistor substrate of claim 12, wherein a surface resistivity of the transparent electrode pattern is from about $15\Omega/\square$ to about $110\Omega/\square$, and a surface resistance of the non-conductive sub-portion is greater than about $1\ M\Omega/\square$.

16. A method of manufacturing a thin-film transistor substrate, the method comprising:
    forming on a substrate, a gate line, a data line and a thin-film transistor, the data line being extended in a direction crossing the gate line, the thin-film transistor being connected to the gate line and the data line; and forming on the substrate, a pixel electrode that includes a transparent electrode portion having conductive fine-wires, and that includes a non-conductive sub-portion, the non-conductive sub-portion comprising at least one member selected from the group of non-conductive fine-wires consisting of oxidized fine-wires, chloridated fine-wires.

17. The method of claim 16, wherein the forming of the pixel electrode comprises:
   forming a homogenous and transparent thin layer having the conductive fine-wires, the homogenous and transparent thin layer being formed on a base substrate on which the switching device is already formed;
   forming a gas impermeable and patterned mask that protects at least a first area of the transparent thin layer from being subjected to a corresponding gas; and
   providing as the corresponding gas, a reactive gas to a second area of the transparent thin layer not protected by the gas impermeable and patterned mask, where the reactive gas chemically modifies the fine-wires of the second area into becoming non-conductive fine-wires.

18. The method of claim 16, wherein the non-conductive sub-portion is formed by irradiating a pulsed laser onto a portion of the transparent thin layer, and where a unit of a pulse length of the pulse laser is about one Pico second.

19. A method of manufacturing thin-film transistor substrate, the method comprising:
   forming a gate line, a data line and a thin-film transistor on a base substrate, the data line being extended in a direction crossing the gate line, the thin-film transistor being connected to the data line and the gate line;
   forming on the base substrate having the formed thin-film transistor, a homogenous transparent thin film layer having a mixture of conductive fine-wires and a liquid polymer precursor composition;
   forming a photo pattern over the transparent thin film layer where the photo pattern blocks a supplied curing light from reaching a first area of the transparent thin film layer and allows the supplied curing light to reach a second area of the transparent thin film layer;
   irradiating a curing light through the photo pattern and onto the exposed second area of the transparent thin film layer; and
   selectively removing from the irradiated transparent thin film layer, the uncured mixture of conductive fine-wires and the polymer precursor composition of the second area fine-wires.

20. The method of claim 19, wherein the polymer precursor composition comprising:
   a mono-functional monomer of about 10 weight % to about 20 weight % with respect to a total weight of the polymer precursor composition;
   a dual-functional monomer of about 20 weight % to about 60 weight % with respect to the total weight of the polymer precursor composition;
   a multi-functional monomer of about 10 weight % to about 30 weight % with respect to the total weight of the polymer precursor composition;
   a photo initiator of about 3 weight % to about 5 weight % with respect to the total weight of the polymer precursor composition; and
   an extra solvent.

* * * * *